US012707610B2

(12) United States Patent
Yli-Peltola

(10) Patent No.: US 12,707,610 B2
(45) Date of Patent: Aug. 11, 2026

(54) INTELLIGENT CABINET WITH RF SHIELD

(71) Applicant: Intelligent Fridges B.V., Nieuw-Vennep (NL)

(72) Inventor: Ilkka Yli-Peltola, Kangasala (FI)

(73) Assignee: Intelligent Fridges B.V., Nieuw-Vennep (NL)

( * ) Notice: Subject to any disclaimer, the term of this patent is extended or adjusted under 35 U.S.C. 154(b) by 71 days.

(21) Appl. No.: 18/863,167

(22) PCT Filed: Apr. 21, 2023

(86) PCT No.: PCT/IB2023/054094
§ 371 (c)(1),
(2) Date: Nov. 5, 2024

(87) PCT Pub. No.: WO2023/214239
PCT Pub. Date: Nov. 9, 2023

(65) Prior Publication Data

US 2025/0301615 A1 Sep. 25, 2025

(30) Foreign Application Priority Data

May 6, 2022 (SE) .................................... 2230134-5

(51) Int. Cl.
*H05K 9/00* (2006.01)

(52) U.S. Cl.
CPC ......... *H05K 9/0041* (2013.01); *H05K 9/0083* (2013.01); *H05K 9/0086* (2013.01)

(58) Field of Classification Search
CPC .................................................... H05K 9/0041
See application file for complete search history.

(56) References Cited

U.S. PATENT DOCUMENTS

2002/0100579 A1* 8/2002 Heikkila ............ H05K 7/20736 165/104.34
2003/0107873 A1* 6/2003 Van Gaal ............... H05K 7/206 361/689

(Continued)

FOREIGN PATENT DOCUMENTS

CN 209731874 U 12/2019
GB 2371722 A 7/2002
WO 2020128937 A1 6/2020

OTHER PUBLICATIONS

International Search Report from corresponding PCT application No. PCT/IB2023/054094, mailed Jun. 28, 2023.

*Primary Examiner* — Hung V Ngo
(74) *Attorney, Agent, or Firm* — Ipsilon USA—NLO

(57) ABSTRACT

An intelligent cabinet (1) comprises a housing (2) with an internal cavity (2*a*) and a separate compartment (2*b*). At least one RFID reader antenna (32) is arranged within the internal cavity (2*a*), and a cooling and/or ventilation arrangement (4) is arranged in the separate compartment (2*b*), outside the internal cavity (2*a*). At least one passage (5) is provided to allow air to circulate between the internal cavity (2*a*) and the cooling and/or ventilation arrangement (4). The internal cavity (2*a*) and the compartment (2*b*) are separated by an internal wall (6) within the housing (2), wherein the passage (5) comprises a plurality of openings (7*a*, 7*b*) through the internal wall (6). The openings are arranged directly in the internal wall (6) or in a separate part (8*a*, 8*b*) being connected to the internal wall. Each of the openings (7*a*, 7*b*) have a maximal extension in the range of 1-20 mm, and preferably 5-15 mm, and at least the surface of the internal wall (6) and/or the separate part (8*a*, 8*b*) comprises a conductive material. Hereby, the openings allow a flow of air through the openings, and at the same time provides attenuation or blocking of RF signals.

15 Claims, 3 Drawing Sheets

(56) References Cited

U.S. PATENT DOCUMENTS

| | | | | |
|---|---|---|---|---|
| 2008/0066475 | A1 | 3/2008 | Cho et al. | |
| 2008/0224875 | A1 | 9/2008 | Phillips et al. | |
| 2010/0328037 | A1 | 12/2010 | Thomas et al. | |
| 2017/0135499 | A1* | 5/2017 | Heinzle | A47F 3/0447 |
| 2018/0372398 | A1* | 12/2018 | Cosgrove | G16H 20/13 |
| 2021/0127525 | A1* | 4/2021 | Charapale | H05K 7/20909 |
| 2023/0229874 | A1* | 7/2023 | Lobbezoo | G07F 11/62<br>312/7.1 |

* cited by examiner

INTELLIGENT CABINET WITH RF SHIELD

This application is a U.S. National Phase under 35 U.S.C. § 371 of International Application No. PCT/IB2023/054094, filed Apr. 21 2023, which claims priority under 35 U.S.C. §§ 119 and 365 to Swedish Application No. 2230134-5 filed May 6, 2022.

TECHNICAL FIELD OF THE INVENTION

The present invention relates to an intelligent cabinet with a radio frequency identification (RFID) reader antenna.

BACKGROUND OF THE INVENTION

RFID tags are nowadays used more and more frequently, and for a wide variety of applications, such as in smart labels/tags. The RFID tag is conventionally arranged as a flat configured transponder, e.g. arranged under a conventional print-coded label, and includes a chip and an antenna. Smart labels offer advantages over conventional barcode labels, such as higher data capacity, possibility to read and/or write outside a direct line of sight, and the ability to read multiple labels or tags at one time. It is also known to incorporate RFID labels directly in a packaging material, to form so-called intelligent packaging products.

One application for RFID tags which is becoming increasingly interesting is in packages comprising food products and the like, There is a recent trend to turn traditional convenience stores into self-service fulfilment centers located regionally or locally, close to homes, workplaces, transport hubs and leisure activities. To this end, unmanned, intelligent cabinets may be used, such as intelligent fridges, intelligent freezers, and the like.

The intelligent cabinets may be used to sell, in an automated way, various products such as consumer products, groceries, beverages, snacks etc. Each product in the intelligent cabinet is equipped with an RFID tag.

The shopping process in an intelligent cabinet is typically the following:

- Authentication of a consumer, e.g. done by the consumer using his smartphone and a smartphone app. Hereby, the consumer is identified and a connection to the consumer's personal payment account or the like is established. When the consumer has been authenticated, the system will send a command to an electric lock of the intelligent cabinet to open the locked door.
- The consumer may then open the door and pick out the products he wants to purchase, and thereafter close the door.
- When the door is closed, the system will run an inventory round inside the intelligent cabinet. Since each product is RFID tagged with tags with individual identification codes (for example Electronic Product Code, "EPC" or Unique Identifier ("UID"), the system will detect which products are still inside the cabinet, and determine which product(s) that are missing compared to the previously made inventory round.
- The system may then display the purchased items and their cost, e.g. on a display on the intelligent cabinet.
- The system will then charge the corresponding amount from the consumer's payment account, and may also send a receipt to his mobile device.
- The cabinet is then ready to receive the next user.

The system always knows the inventory of the cabinet. When the inventory levels are determined to be low, the system will trigger a replenishment cycle. A replenishment batch of products may then be delivered to the intelligent cabinet from a centralized warehouse, distribution center or the like.

Intelligent cabinets may be used in various locations, such as in office buildings, fitness and sport centers, schools, hotels, gas stations, and the like. Kiosks and small convenience stores can also be converted into fully digitalized unmanned stores with no personnel by use of such intelligent cabinets. With an offering of 10-15 intelligent cabinets, a small store can provide an assortment that represents a typical traditional kiosk. In facilities that have limited opening hours, such as lunch restaurants, cafés and the like, intelligent cabinets may be used to provide a basic offering of food, snacks and daily goods outside the opening hours.

The intelligent cabinets can be arranged for indoor use but may also be designed for outdoor use and tough conditions.

Such an intelligent cabinet is e.g. disclosed in WO 2020/128937.

However, there is currently a problem to produce intelligent cabinets in a cost-effective way, and thereby to make the cabinets affordable. A particular problem is how to obtain adequate RF shielding. The walls of intelligent cabinets is often made of metal or other conductive material, and thereby prevents radio waves from propagating in to the cabinet from the outside, and vice versa. However, despite this, RF leakage often occurs, e.g. in door frames and at other openings. The RF leakage impairs the operation of the intelligent cabinet, since it increases the risk that RFID reader antennas inside the cabinet reads RFID tags outside the cabinet, and vice versa. Hence, there is a risk that removal of items from the cabinet remain undetected, or that other errors occur.

There is therefore a need for an improved intelligent cabinet, which can be produced cost-efficiently.

SUMMARY OF THE INVENTION

It is therefore an object of the present invention to provide an intelligent cabinet which alleviate at least part of the above-discussed problems, and at least partially address one or more of the above-mentioned needs.

This object is obtained by means of an intelligent cabinet in accordance with the appended claims.

According to an aspect of the invention, there is provided an intelligent cabinet comprising:

- a housing with an internal cavity;
- at least one RFID reader antenna arranged within the internal cavity;
- a cooling and/or ventilation arrangement arranged in a compartment of the housing outside said internal cavity; and
- at least one passage to allow air to circulate between the internal cavity and the cooling and/or ventilation arrangement;
- wherein the internal cavity and the compartment are separated by an internal wall within the housing, wherein the passage comprises a plurality of openings through said internal wall, the openings being arranged directly in the internal wall or in a separate part being connected to the internal wall, each of said openings having a maximal extension in the range of 0.5-20 mm, and preferably 5-15 mm, and wherein at least the surface of the internal wall and/or said separate part comprises a conductive material.

The invention is related to RFID enabled cabinets, i.e. intelligent cabinets with an RFID reader antenna arranged within the internal cavity, with an integrated cooling arrangement, such as an intelligent fridge or freezer, or with an integrated ventilation arrangement, such as in intelligent cabinets where air flow to the internal cavity is needed, such as for maintaining a certain humidity in the cabinet, providing fresh oxygen to the interior, removing odor from the cavity, etc.

The RFID reader antenna is an antenna for use internally within a cabinet, and which transmits and receives signals from RFID tags located inside the cabinet. The RFID reader antenna may operate within the Ultra High Frequency (UHF) band, and in particular in a band within the range of 750-1400 MHz, and preferably within the range of 860-960 MHz. Such RFID reader antennas are per se previously known, and need not be further discussed. The RFID reader antenna may be arranged to communicate with RFID tags that are passive, i.e. which are powered by the reader's electromagnetic field, or active, i.e. powered by an onboard battery.

The cooling and/or ventilation arrangement is arranged in a separate compartment within the housing, such as in a top compartment above the roof of the internal cavity.

The cooling arrangement may comprise a compressor, evaporator and condenser coils, and fans for air flow. The cabinet may have several air channels between the internal cavity and the cooling arrangement, for intake and exhaust of air. The fans are used to circulate air through cooling unit. It is further often necessary to have major openings on the cabinet housing, such as on the roof, to allow air flow to and from the cooling arrangement. Intelligent cabinets with cooling arrangements are per se known, and an intelligent cabinet with a cooling arrangement is e.g. the Selfly Store cabinet produced and sold by Stora Enso.

Similar approach applies to non-cooled cabinets where major openings or external fans may be deployed to circulate air, but without the cooling system.

The present invention is based on the realization that for such intelligent cabinets having a cooling and/or ventilation arrangement, the openings provided for air intake and air exhaustion are significant sources of RF leakage.

A cabinet RFID system may comprise one or more RFID reader antennas arranged within the internal cavity, and connected to an RFID reader arranged within the cabinet or externally from the cabinet. The cabinet RF shielding structures, such a metal housing, may be arranged to avoid RFID transmission power leaking outside the cabinet/cavity. The items inside cavity have RFID tags and adequate RF shielding is essential to enable for the system to detect if a detected RFID tag is inside or outside the cabinet/cavity. Ideally, for the RFID functionality, the cabinet housing should have been formed as an entirely closed uniform metal enclosure without any openings, to form a perfect Faraday cage, but naturally this is in conflict with e.g. the airflow requirements.

It has been found by the present inventor that RFID signals in conventional vented or cooled intelligent cabinets pass through air channel to the cooling arrangement, and from there may easily escape to the outside of the cabinet, since the cooling arrangement would normally not block RFID signals.

Hypothetically, it may seem as an option to arrange also the cooling and/or ventilation arrangement inside the internal cavity, or to fully cover a separate compartment in metal. However, such a solution would be costly, and also often not possible. Such solutions may also negatively affect the performance of the cooling and/or ventilation arrangement and may also make it more difficult to provide service and repair.

Another hypothetical solution would have been to reduce the RFID transmission power inside the cabinet. However, such a solution would have a negative effect on the systems capability of correctly detecting and reading RFID tags inside the cabinet, and significantly increasing the risk of errors.

The plurality of openings of the present invention, preferably arranged in a grid pattern, allows an air flow route between the internal cavity and the compartment housing the cooling and/or ventilation arrangement, and at the same time blocks or attenuates the RFID signals from the intema cavity. This enables a simple and cost-effective way to handle ventilation/cooling and RFID signal blocking with a single part or sheet.

The invention is also based on the realization that RF signal attenuation/blocking becomes more efficient when placed as close to the source, i.e. the internal cavity, as possible. In the present invention, the RF signal attenuation/blocking occurs immediately at the border of the internal cavity, in the wall or roof defining the internal cavity, which makes the RF signal attenuation/blocking highly efficient. This also makes it possible to use larger openings and/or more openings, which facilitates production and improves the air flow, and at the same time still obtain very good attenuation/blocking of the RF signals.

In an embodiment, the grid of openings may have a total area of 200-1000 $cm^2$, and preferably 300-700 $cm^2$, and more preferably 400-600 $cm^2$. The area may e.g. be 50 cm in length and 10 cm in width. Such an area is e.g. well suited for an ordinarily sized fridge, being e.g. 60 cm wide and 70 cm deep, but may need to be modified for other sizes. More generally, the grid area is preferably 5-40 of the area of the internal wall, i.e. of the ceiling of the internal cavity, and preferably 10-15%.

The compartment housing the cooling and/or ventilation arrangement is preferably arranged on top of the internal cavity, whereby the internal wall forms a ceiling for the internal cavity. It has been found by the present inventor that the risk of RF leakage is particularly great for intelligent cabinets with cooling and/or ventilation arrangements arranged high up in the cabinet, and that the additional RF shielding provided by the invention thereby becomes particularly useful.

In an embodiment, the openings in total have an area being 20-90% of a cross-sectional area of the passage, and preferably 40-70%, and more preferably 45-55%. This means that in the area where the openings are arranged, about 50% of the area is open, and about 50% closed. This is a useful compromise between on the one hand providing as much RF attenuation as possible, which would be improved by a low opening area, and on the other hand providing as low resistance for the air flow as possible, which would be improved by a high degree of opening area. It has been found that in the above-discussed ranges, both the RF attenuation and the air flow are acceptable.

The openings should have a maximal extension in the range of 0.5-20 mm, and preferably 5-15 mm. In an embodiment, the openings have a maximal extension in the range of 1-10 mm. The maximal extension corresponds to the diameter in respect of circularly shaped openings, and the longest side in respect of rectangularly shaped openings. It has generally been found that too small openings are costly and cumbersome to produce, whereas too large openings would provide inadequate RF shielding.

In one embodiment, the plurality of openings is formed directly in the internal wall. Hereby, no additional material or components are required. The openings may be formed in the plate forming the internal wall e.g. by drilling or cutting processes. This makes manufacturing more cost-efficient, since no additional parts or components are needed.

Alternatively, the plurality of openings is arranged in the separate part connected to the internal wall. In such embodiments, larger cut-out openings may be formed in the internal wall, and parts provided with the plurality of openings may be arranged overlying the cut-out openings, or arranged within and encircled by the cut-out openings.

The plurality of openings is preferably arranged in a material layer of the internal wall or the separate part having a thickness of 0.2-10 mm, and preferably 0.4-1.2 mm, and more preferably 0-5-1.0 mm.

The at least one passage preferably comprises at least two passageways, each passageway comprising said plurality of openings each having a maximal extension in the range of 5-15 mm. In this case, one of the passageways may function as an intake for an inflow of air into the internal cavity, whereas the other passageway may function as an exhaust, for discharge of air from the internal cavity. However, if only one passage is provided, this passage may be used for forwarding air in both directions, e.g. intermittently. Further, more than two passageways may also be provided.

The openings are preferably arranged to provide at least 20 dB attenuation at Ultra High Frequency band, and preferably at least 25 dB, and more preferably at least 30 dB. It has been found that an attenuation of at least 20 dB, and preferably slightly more, provides an adequate attenuation and shielding of the RF waves, thereby ensuring proper operation of the intelligent cabinet.

In order to form an RF shield, at least the surface of the internal wall and/or said separate part comprises a conductive material. In one embodiment, this is realized by the plurality of openings being preferably arranged in a solid plate of conductive material, such as steel, aluminum or copper. However, alternatively, the plurality of openings may be arranged in a plate of non-conductive material coated with a conductive layer on the surface.

The conductive material is preferably having a conductivity equal to the conductivity of metals, such as pure steel or aluminum. However, somewhat lower conductivity can also be used to provide adequate conductivity. For example, the surface may be formed by a material having dispersed metallic particles arranged within a body of non-conductive material, etc.

The internal cavity of the intelligent cabinet is preferably RF shielded.

The openings are preferably arranged in a grid pattern, and preferably a rectangular grid pattern. The openings may e.g. be arranged in parallel rows. The openings of the rows may be aligned with each other, forming a checkerboard pattern. However, alternatively, the openings of the rows may be displaced in relation to each other. For example, the openings of every second row may be arranged in between the openings of the adjacent rows. Other configurations for the openings are also feasible, such as grid patterns forming circular or oval shapes, e.g. with openings arranged along concentric circles, arranged as a helix, arranged in a honeycomb structure, etc.

The openings may be formed as cut-out holes in a plate. Such opening may e.g. be formed by drilling or other forms of machining. Thus, the openings may be formed as integrated within the internal wall, forming the roof or ceiling of the internal cavity. Integration of the openings in a sheet or plate also functioning as the internal wall, forming a wall or roof of the internal cavity, facilitates production, and also provide a very robust construction. The openings may have a circular shape, but may also be formed as ovals, rectangles and the like.

However, alternatively, the openings may be formed in a separate part, which is then connected to the interna wall, and overlying a larger cut-out opening therein. The openings may then e.g. be formed by a metal wire mesh or netting. The mesh may be formed by sets of wires arranged in two orthogonal directions and connected by at least one of welding, soldering and weaving. A netting may be formed by weaving, knitting or other per se known method of forming nets of metal wire or other conductive wire material. The mesh or netting may be connected to the internal wall by soldering, welding or the like.

It will be appreciated that the above-mentioned detailed structures and advantages of the first aspect of the present invention also apply to the further aspects of the present invention. These and other aspects of the invention will be apparent from and elucidated with reference to the embodiments described hereinafter.

BRIEF DESCRIPTION OF THE DRAWINGS

The present invention will be described in more detail with reference to the appended drawings, showing currently preferred embodiments of the invention.

DETAILED DESCRIPTION OF CURRENTLY PREFERRED EMBODIMENTS

Figures 1, 2:
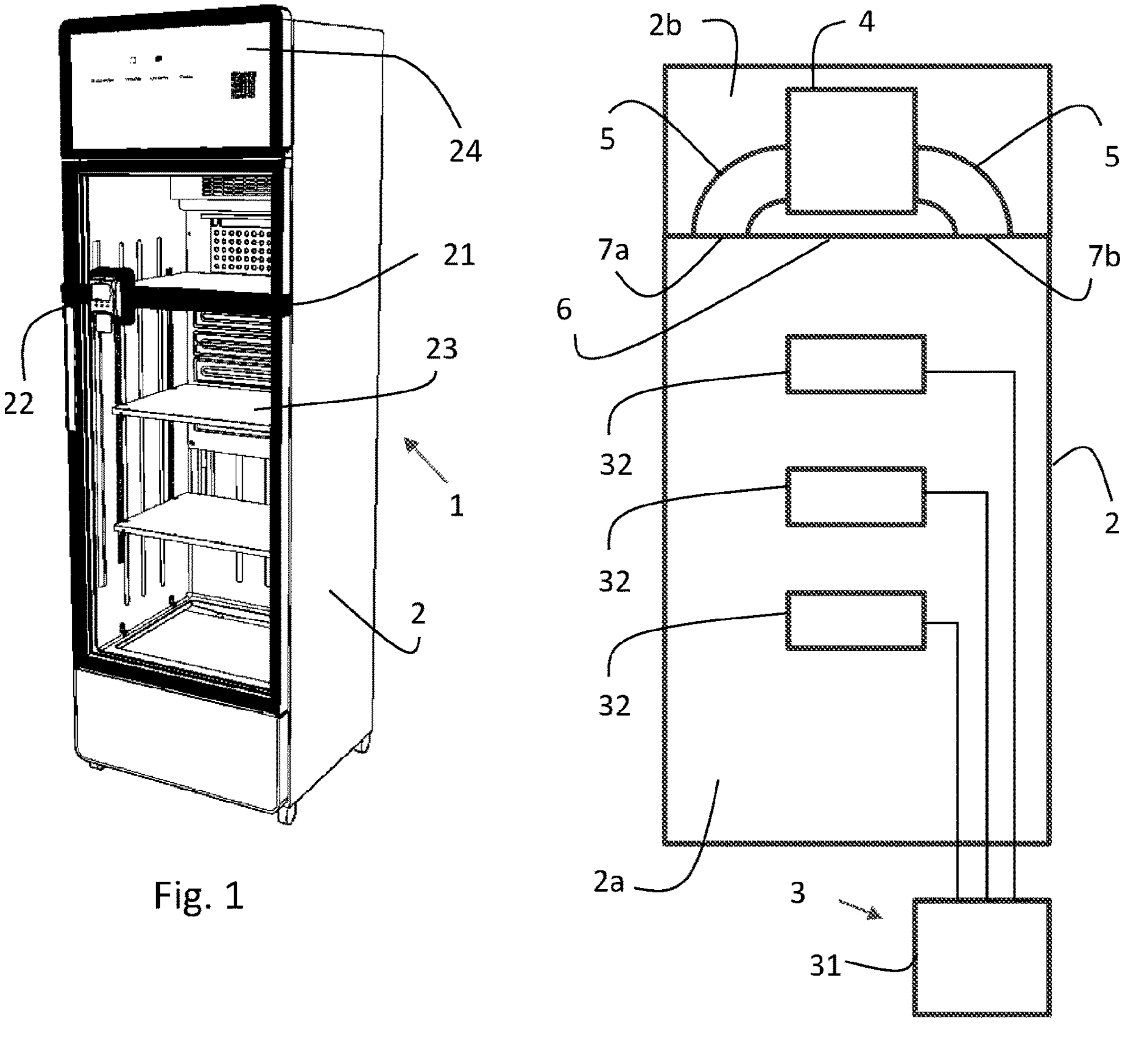
FIG. 1 is a schematic perspective view of an intelligent cabinet in accordance with an embodiment of the present invention.
FIG. 2 is a simplified schematic sideview of the intelligent cabinet of FIG. 1, illustrating the cavities and compartments of the housing, in accordance with an embodiment.

In the following detailed description preferred embodiments of the invention will be described. However, it is to be understood that features of the different embodiments are exchangeable between the embodiments and may be combined in different ways, unless anything else is specifically indicated. It may also be noted that, for the sake of clarity, the dimensions of certain components illustrated in the drawings may differ from the corresponding dimensions in real-life implementations of the invention, such as the thickness of various layers, the relative dimensions of parts, etc.

Figure 3:
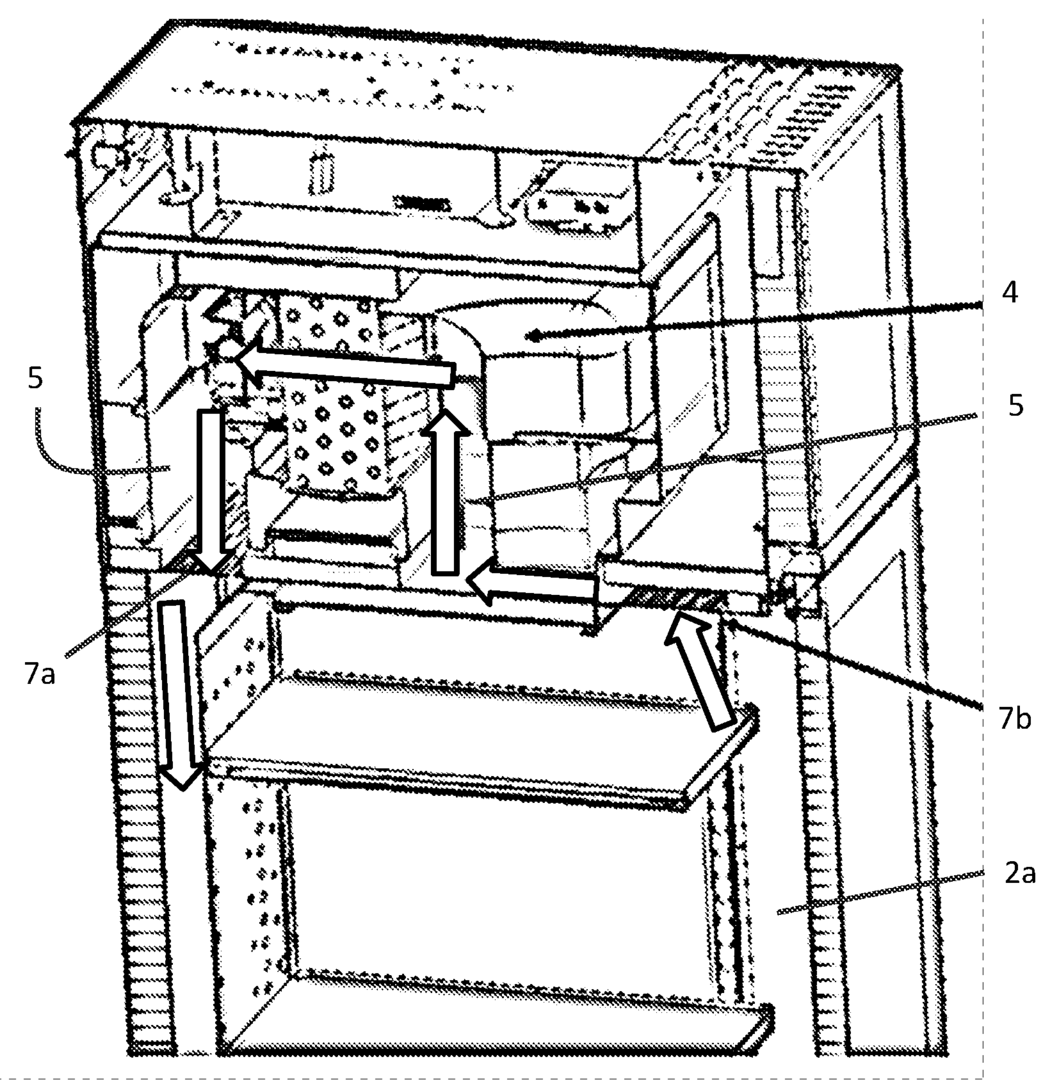
FIG. 3 is a more detailed schematic illustration of a cooling system useable in the intelligent cabinet of FIG. 1, in accordance with another an embodiment.

With reference to FIGS. 1-3, an intelligent cabinet 1 may comprise a housing 2, with an internal cavity 2*a*, provided with a door 21 with a remotely controlled lock 22. The cabinet may further be provided with at least one shelf 23, and preferably a plurality of shelves. The cabinet may further be provided with an externally facing display 24.

In the illustrative embodiment, the intelligent cabinet is a smart fridge. However, the cabinet may also be a smart freezer, or a cabinet for storage of products at room temperature, or even at somewhat elevated temperatures.

The intelligent cabinet may comprise a purchase identification system (not shown) for identifying the consumer and connecting to the consumer's personal payment account. This is typically done by consumer using his personal mobile device, e.g. a smartphone, e.g. to scan a QR code shown on the smart fridge display. The QR code may launch a mobile app (e.g. Apple Pay, Google Pay, PayPal, Alipay, Wechat Pay, MobilePay, Swift or similar) on the mobile device and thus identifying the consumer. However, as would be appreciated by the skilled reader, other types of identifying methods and payment methods are possible e.g. via the consumer's credit card.

The intelligent cabinet is arranged to house a storage for RFID tagged products. Each product preferably having a package, wherein each product packaging is equipped with an RFID tag with individual identification codes (for example Electronic Product Code, "EPC" or Unique identifier "UID".

The intelligent cabinet further comprises a lockable door 21, which is openable after identification of the consumer.

Further, the intelligent cabinet comprises an RFID reader system 3 with a controller/reader 31 and one or more RFID reader antennas 32 for reading the RFID tagged products in the storage of the internal cavity 2*a* of the intelligent cabinet. In the illustrative example, three RFID reader antennas are provided, but more or fewer antennas are also feasible, such as only one or two RFID reader antennas. The RFID reader antennas 32 are connected to a reader/controller 31. In the illustrative example, the reader/controller 31 is arranged outside the housing 2. However, the reader/controller 31 may also be arranged inside the housing 2. It is also possible to arrange the reader/controller remote from the cabinet. The connection between the reader/controller 31 and the RFID reader antennas 32 can be through wired connections or wireless connections.

The RFID reader is connected to a software system of the intelligent cabinet, such that the system can detect and identify what products are inside the cabinet. As the system also knows what items were inside the cabinet before the consumer opened the door, it can deduct which products the consumer took out (=purchased). Based on this, the system can consequently determine which exact product ID's the consumer purchased.

A purchase procedure may typically be made as follows:

- Identifying the consumer via the consumer's mobile device, e.g. a smartphone. A preferred method is that the consumer using his smartphone to scan a QR code shown on the display 24 of the intelligent cabinet. The QR code launches a mobile app (such as Apple Pay, Google Pay, PayPal, Alipay, Wechat Pay, MobilePay, Swift or similar) on the consumer's mobile device and connecting to the consumer's personal payment account. However, other types of identifying methods are possible e.g. via the consumer's credit card.
- After identifying of the consumer, the system will open the lock 22, thereby unlocking the locked door 21 to the cabinet, such that the consumer can open the door. When the door is open the consumer can pick out desired products with packaging from the cabinet. Each product packaging is preferably equipped with an RFID tag with individual identification codes (for example Electronic Product Code, "EPC" or Unique identifier "UID". Thereafter, the consumer closes the door 21 and the door locks automatically.
- When the door 21 is locked the system will automatically run an inventory round to detect which products with packaging that have been picked out from the cabinet by the consumer.
- The system will thereafter automatically charge the cost for the purchased products from the consumer's payment account and sending a receipt to the mobile device.

The RFID reader antenna may be arranged in various places in the cabinet. Further, more than one RFID reader antenna may be provided within the cabinet. Preferably, the RFID reader antenna(s) are arranged to have its/their reading zones covering the entire interior space of the cabinet, and preferably with an overlap so that at least some positions, and preferably most positions, and most preferably all positions within the cabinet are covered by at least two antennas.

In an embodiment, the RFID reader antenna(s) 32 may be arranged connected to or integrated with a shelf/shelves 23 of the cabinet 2. Alternatively, or additionally, one or more RFID reader antenna(s) 1 may also be provided at other locations in the cabinet, such as in or on the roof, in or on the floor, or in or at the side walls.

The RFID reader antenna(s) 32 are preferably configured for operation within the UHF band, for transmitting and receiving signals from RFID tags located inside the cabinet. The RFID reader antenna may in particular operate in a band within the range of 750-1400 MHz, and preferably within the range of 860-960 MHz.

The intelligent cabinet further comprises a cooling and/or ventilation arrangement 4, arranged in a separate compartment 2*b* of the housing. The compartment 2*b* is preferably arranged above the internal cavity 2*a*, but other arrangements are also feasible, such as below the internal cavity, behind the internal cavity, etc.

The internal cavity 2*a* and the compartment 2*b* housing the cooling and/or ventilation arrangement 4 are separated by an internal wall 6, which may form the bottom of the compartment 2*b* and the ceiling of the internal cavity 2*b*.

At least one passage 5, and preferably two passages 5, are provided to allow air to circulate between the internal cavity 2*a* and the cooling and/or ventilation arrangement 4. The passages 5 each comprises a plurality of openings 7*a*, 7*b* through the internal wall, the openings being arranged directly in the internal wall or in a separate part being connected to the internal wall. The openings are preferably arranged in a grid pattern, and each of the openings have a maximal extension in the range of 0.5-20 mm, and preferably 5-15 mm. At least the surface of the internal wall and/or the separate part comprises a conductive material.

The cooling arrangement 4 may comprise a compressor, evaporator and condenser coils, and fans for air flow. Cooling and ventilation arrangements are per se known in the art, and e.g. known from the commercially available intelligent cabinets Selfly Store, produced and sold by Stora Enso, and need not be further described. As best seen in FIG. 3, and illustrated with black arrows, air exits the internal cavity 2*a* through the openings 7*b*, and is led through the passages 5 forming a pathway through the cooling and/or ventilation arrangement, and then enters the internal cavity 2*a* through openings 7*a*. The fans are used to circulate air through the optional cooling unit, if cooling is desired, or only to circulate the air if only ventilation is needed.

The plurality of openings, preferably arranged in a grid pattern, allows an air flow route between the internal cavity 2*a* and the compartment 2*b* housing the cooling and/or ventilation arrangement 4, and at the same time blocks or attenuates the RFID signals from escaping from the internal cavity 2*a*.

Figure 4:
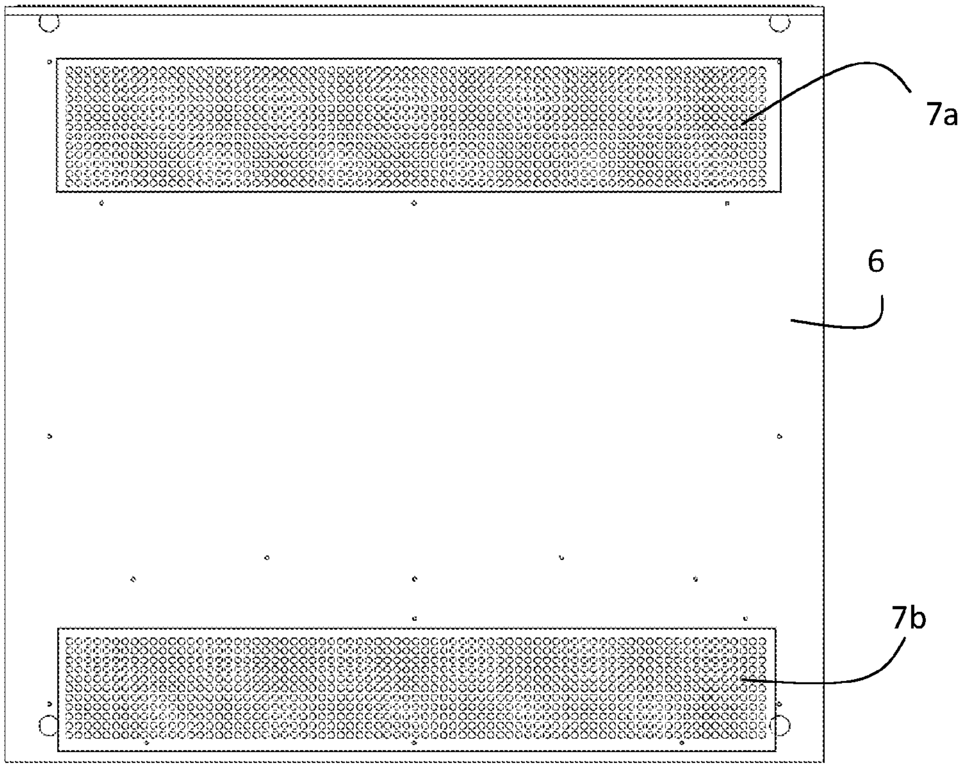
FIG. 4 is a top plan view of plate provided with a plurality of openings, and useable as a separation wall between a cavity and compartment within the intelligent cabinet of FIG. 1, in accordance with an embodiment of the present invention.

With reference to FIG. 4, the openings 7*a*, 7*b* may be formed as cut-out holes in a plate. Such opening may e.g. be formed by drilling or other forms of machining. Thus, the openings may be formed as integrated within the internal wall 6, forming the roof or ceiling of the internal cavity 2*a*. The openings may have a circular shape, but may also be formed as ovals, rectangles and the like. In this embodiment, the plurality of openings is formed directly in the internal wall 6. Hereby, no additional material or components are required.

Figure 5:
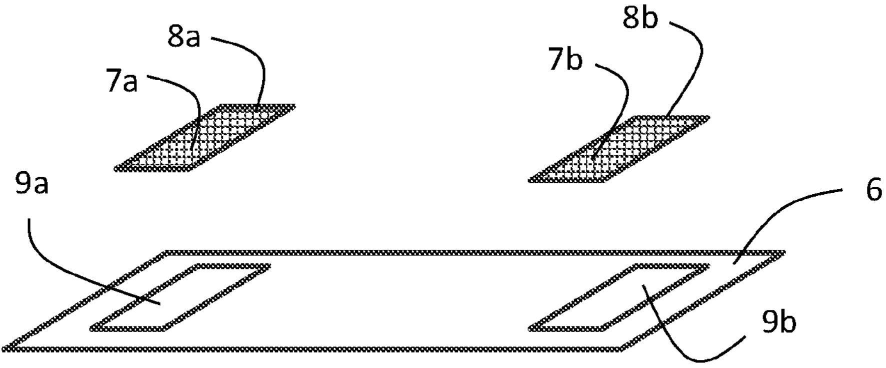
FIG. 5 is an exploded schematic view of a plate provided with a plurality of openings, and useable as a separation wall between a cavity and compartment within the intelligent cabinet of FIG. 1, in accordance with another embodiment of the present invention.

However, alternatively, as illustrated in FIG. 5, the openings may be formed in separate parts 8*a*, 8*b*, which are then connected to the interna wall 6, and overlying a larger cut-out openings 9*a*, 9*b* therein. The openings may then e.g. be formed by a metal wire mesh or netting. The mesh may be formed by sets of wires arranged in two orthogonal directions and connected by at least one of welding, soldering and weaving. A netting may be formed by weaving, knitting or other per se known method of forming nets of metal wire or other conductive wire material. The mesh or netting may be connected to the internal wall by soldering, welding or the like.

The grid of openings may have a total area of 200-1000 $cm^2$, and preferably 300-700 $cm^2$, and more preferably 400-600 $cm^2$. The area may e.g. be 50 cm in length and 10 cm in width. Such an area is e.g. well suited for an ordinarily sized fridge, being e.g. 60 cm wide and 70 cm deep, but may need to be modified for other sizes. More generally, the grid area is preferably 5-40 of the area of the internal wall, i.e. of the ceiling of the internal cavity, and preferably 10-15%.

The openings may in total have an area being 20-90% of a cross-sectional area of the passage, and preferably 40-70%, and more preferably 45-55%. This means that in the areas 7*a*, 7*b* where the openings are arranged, about 50% of the area is open, and about 50% closed.

The openings should have a maximal extension in the range of 0.5-20 mm, and preferably 5-15 mm. In an embodiment, the opening have a maximal extension in the range of 1-10 mm.

Alternatively, the plurality of openings is arranged in the separate part connected to the internal wall. In such embodiments, larger cut-out openings may be formed in the internal wall, and parts provided with the plurality of openings may be arranged overlying the cut-out openings, or arranged within and encircled by the cut-out openings.

The plurality of openings is preferably arranged in a material layer of the internal wall or the separate part having a thickness of 0.2-10 mm, and preferably 0.4-1.2 mm, and more preferably 0-5-1.0 mm.

The openings 7*a*, 7*b* are preferably arranged to provide at least 20 dB attenuation at Ultra High Frequency band, and preferably at least 25 dB, and more preferably at least 30 dB. It has been found that an attenuation of at least 20 dB, and preferably slightly more, provides an adequate attenuation and shielding of the RF waves, thereby ensuring proper operation of the intelligent cabinet.

In order to form an RF shield, at least the surface of the internal wall 6 and/or the separate parts 8*a*, 8*b* comprise a conductive material. In one embodiment, this is realized by the plurality of openings being preferably arranged in a solid plate of conductive material, such as steel, aluminum or copper. However, alternatively, the plurality of openings may be arranged in a plate of non-conductive material coated with a conductive layer on the surface.

The person skilled in the art realizes that the present invention is not limited to the above-described embodiments. For example, the grid pattern of the openings need not be rectangular, and many other patterns may also be used. Further, the intelligent cabinet need not have a cooling arrangement, and in embodiments the cooling and/or ventilation arrangement may be used only for ventilation. Such and other obvious modifications must be considered to be within the scope of the present invention, as it is defined by the appended claims. It should be noted that the above-described embodiments illustrate rather than limit the invention, and that those skilled in the art will be able to design many alternative embodiments without departing from the scope of the appended claims. In the claims, any reference signs placed between parentheses shall not be construed as limiting to the claim. The word “comprising” does not exclude the presence of other elements or steps than those listed in the claim. The word “a” or “an” preceding an element does not exclude the presence of a plurality of such elements.

The invention claimed is:

1. An intelligent cabinet comprising:

a housing with an internal cavity;

at least one RFID reader antenna-arranged within the internal cavity;

a cooling arrangement, a ventilation arrangement, or both arranged in a compartment of the housing outside said internal cavity; and at least one passage to allow air to circulate between the internal cavity and the cooling or ventilation arrangement;

wherein the internal cavity and the compartment are separated by an internal wall-within the housing, wherein the at least one passage comprises a plurality of openings through said internal wall, the openings being arranged directly in the internal wall or in a separate part being connected to the internal wall, each of said openings having a maximal extension in a range of 0.5-20 mm, and wherein at least the surface of the internal wall, the said separate part, or both comprises a conductive material.

2. The intelligent cabinet of claim 1, wherein the compartment-housing the cooling or ventilation arrangement is arranged on top of the internal cavity, whereby the internal wall-forms a ceiling for the internal cavity.

3. The intelligent cabinet of claim 1, wherein the openings in total have an area being 20-90% of a cross-sectional area of the passage.

4. The intelligent cabinet of claim 1, wherein the plurality of openings is formed directly in the internal wall.

5. The intelligent cabinet of claim 1, wherein the plurality of openings is arranged in the separate part connected to the internal wall.

6. The intelligent cabinet of claim 5, wherein the separate part is arranged overlying a cut-out in the internal wall.

7. The intelligent cabinet of claim 1, wherein the plurality of openings is arranged in a material layer of said internal wall or said separate part having a thickness of 0.2-10 mm.

8. The intelligent cabinet of claim 1, wherein the at least one passage-comprises at least two passageways, each passageway comprising a plurality of openings, and wherein each opening comprising a maximal extension in the range of 5-15 mm.

9. The intelligent cabinet of claim 1, wherein the plurality of openings is arranged to provide at least 20 dB attenuation at Ultra High Frequency band.

10. The intelligent cabinet of claim 1, wherein the plurality of openings is arranged in a solid plate of conductive material.

11. The intelligent cabinet of claim 1, wherein the plurality of openings is arranged in a plate of non-conductive material coated with a conductive layer on the surface or a non-conductive material filled with conductive particles.

12. The intelligent cabinet of claim 1, wherein the internal cavity is RF shielded.

13. The intelligent cabinet of claim 1, wherein the openings are arranged in a grid pattern.

14. The intelligent cabinet of claim 1, wherein the openings are formed as cut-out holes in a plate.

15. The intelligent cabinet of claim 1, wherein the openings are formed by a metal wire mesh or netting.

* * * * *